(12) United States Patent
Kim et al.

(10) Patent No.: US 10,535,826 B2
(45) Date of Patent: Jan. 14, 2020

(54) FOLDABLE DISPLAY APPARATUS INCLUDING A SUB-LAYER AND A PROTECTIVE FILM AND METHOD OF MANUFACTURING THE SAME

(71) Applicant: SAMSUNG DISPLAY CO., LTD., Yongin-si, Gyeonggi-Do (KR)

(72) Inventors: Minsang Kim, Yongin-si (KR); Ohjune Kwon, Yongin-si (KR); Doohwan Kim, Yongin-si (KR); Seungwook Kwon, Yongin-si (KR); Hyojeong Kwon, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/110,433

(22) Filed: Aug. 23, 2018

(65) Prior Publication Data

US 2019/0081256 A1 Mar. 14, 2019

(30) Foreign Application Priority Data

Sep. 11, 2017 (KR) ........................ 10-2017-0115914

(51) Int. Cl.
| | | |
|---|---|---|
| H01L 51/00 | (2006.01) | |
| H01L 51/52 | (2006.01) | |
| H01L 51/56 | (2006.01) | |
| H01L 27/32 | (2006.01) | |

(52) U.S. Cl.
CPC ...... *H01L 51/0097* (2013.01); *H01L 27/3211* (2013.01); *H01L 51/529* (2013.01); *H01L 51/56* (2013.01); *H01L 27/3244* (2013.01); *H01L 2227/323* (2013.01)

(58) Field of Classification Search
CPC ............. H01L 51/0097; H01L 27/3244; H01L 2227/323; H01L 51/529; H01L 51/56; H01L 27/3211
See application file for complete search history.

(56) References Cited

U.S. PATENT DOCUMENTS

| | | |
|---|---|---|
| 9,529,217 B1 | 12/2016 | Kim |
| 9,706,607 B2 * | 7/2017 | Kim ..................... H05B 33/04 |
| 9,769,919 B2 | 9/2017 | Park et al. |

(Continued)

FOREIGN PATENT DOCUMENTS

| | | |
|---|---|---|
| KR | 10-2015-0014713 | 2/2015 |
| KR | 10-2016-0145230 | 12/2016 |
| KR | 10-2017-0047713 | 5/2017 |

*Primary Examiner* — Galina G Yushina
(74) *Attorney, Agent, or Firm* — F. Chau & Associates, LLC (57) ABSTRACT

A foldable display apparatus includes a display panel that is foldable, a protective film, that is foldable, disposed on one surface of the display panel, and a sub-layer disposed on the protective film. A folding portion of the display apparatus includes a thin film zone, of the protective film, that is thinner than a main body of the protective film, and a pair of bumps disposed on opposing sides of the thin film zone, each of the pair of bumps having a thickness greater than that of the main body of the protective film. When the foldable display apparatus is in a folding state, a portion of the sub-layer is provided between the pair of bumps and is pressed by the pair of bumps.

23 Claims, 7 Drawing Sheets

(56) References Cited

U.S. PATENT DOCUMENTS

| | | | |
|---|---|---|---|
| 2014/0042406 A1* | 2/2014 | Degner | H01L 27/326 257/40 |
| 2017/0062485 A1 | 3/2017 | Kwon et al. | |
| 2018/0226611 A1* | 8/2018 | Andou | H01L 51/5253 |
| 2019/0033493 A1* | 1/2019 | Kwon | G02B 1/14 |
| 2019/0074478 A1* | 3/2019 | Kwon | H01L 51/5253 |

* cited by examiner

FOLDABLE DISPLAY APPARATUS INCLUDING A SUB-LAYER AND A PROTECTIVE FILM AND METHOD OF MANUFACTURING THE SAME

CROSS-REFERENCE TO RELATED APPLICATION

This application claims priority under 35 U.S.C. § 119 to Korean Patent Application No. 10-2017-0115914, filed on Sep. 11, 2017, in the Korean Intellectual Property Office, the disclosure of which is incorporated by reference herein in its entirety.

Technical Field

Exemplary embodiments of the present inventive concept relate to a foldable display apparatus, and more particularly, to a foldable display apparatus including a sub-layer and a protective film and a method of manufacturing the foldable display apparatus.

Discussion of the Related Art

A display apparatus such as an organic light-emitting display apparatus may be flexible, and thus may be manufactured to have a foldable structure.

Such a foldable display apparatus generally has a structure in which a protective film is disposed on a flexible display panel and a sub-layer. For example, a heat sink plate may be provided on the protective film.

When the foldable display apparatus remains folded for a long time or repeatedly folded and unfolded over a long period of time, stress may be concentrated on a specific portion of a folding portion of the foldable display apparatus. For example, an end portion of the protective film may be positioned in the folding portion, and thus, the protective film may peel off from the display panel or wiring may be damaged due to the folding portion being folded an excessive number of times.

SUMMARY

According to an exemplary embodiment of the present inventive concept, a foldable display apparatus includes a display panel that is foldable, a protective film, that is foldable, disposed on one surface of the display panel, and a sub-layer disposed on the protective film. A folding portion of the display apparatus includes a thin film zone, of the protective film, that is thinner than a main body of the protective film, and a pair of bumps disposed on opposing sides of the thin film zone, each of the pair of bumps having a thickness greater than that of the main body of the protective film. When the foldable display apparatus is in a folding state, a portion of the sub-layer is provided between the pair of bumps and is pressed by the pair of bumps.

In an exemplary embodiment of the present inventive concept, the sub-layer includes a heat sink plate disposed on the protective film, and a cushion film disposed on the heat sink plate.

In an exemplary embodiment of the present inventive concept, in the folding state, the heat sink plate is provided between the pair of bumps and pressed by the pair of bumps.

In an exemplary embodiment of the present inventive concept, each bump of the pair of bumps includes a first inclined surface that is in contact with the thin film zone.

In an exemplary embodiment of the present inventive concept, the first inclined surface has a plurality of different inclinations.

In an exemplary embodiment of the present inventive concept, in the folding state, centers of the pair of bumps coincide with each other.

In an exemplary embodiment of the present inventive concept, in the folding state, centers of the pair of bumps are shifted away from each other.

According to an exemplary embodiment of the present inventive concept, a method of manufacturing a foldable display apparatus, the method including providing a protective film on one surface of a display panel that is foldable. The method further includes forming a thin film zone that is thinner than both a main body of the protective film and a pair of bumps protruding from the main body of the protective film on opposite sides of the thin film zone by removing a portion of the protective film corresponding to a folding portion of the display panel to a predetermined depth. Each of the pair of bumps has a thickness greater than that of the main body of the protective film. The method additionally includes forming a sub-layer on the protective film and arranging the sub-layer such that while in a folding state, a portion of the sub-layer is provided between the pair of bumps and is pressed by the pair of bumps.

In an exemplary embodiment of the present inventive concept, the forming of the thin film zone and the pair of bumps includes heating and melting the portion of the protective film corresponding to the folding portion.

In an exemplary embodiment of the present inventive concept, the heating is performed by contact with a heat block.

In an exemplary embodiment of the present inventive concept, the heat block is heated to a range of about 400 to about 520° C.

In an exemplary embodiment of the present inventive concept, a cross section of a head of the heat block contacting the protective film is round, quadrangular, or a multi-staged shape.

In an exemplary embodiment of the present inventive concept, a thickness of the thin film zone is adjusted by varying a contact pressure of the heat block.

In an exemplary embodiment of the present inventive concept, inclined surfaces are formed on surfaces of the pair of bumps which are in contact with the thin film zone when forming the pair of bumps and the thin film zone.

In an exemplary embodiment of the present inventive concept, each inclined surface has a plurality of different inclinations.

In an exemplary embodiment of the present inventive concept, the sub-layer includes a heat sink plate disposed on the protective film and a cushion film disposed on the heat sink plate.

In an exemplary embodiment of the present inventive concept, in the folding state, the heat sink plate is provided between the pair of bumps and is pressed by the pair of bumps.

In an exemplary embodiment of the present inventive concept, in the folding state, centers of the pair of bumps coincide with each other.

In an exemplary embodiment of the present inventive concept, in the folding state, centers of the pair of bumps are shifted away from each other.

In an exemplary embodiment of the present inventive concept, a folding direction of the folding portion is a direction in which the display panel goes to face outward of the foldable display apparatus and the protective film comes to face inward of the foldable display apparatus.

According to an exemplary embodiment of the present inventive concept, a foldable display apparatus includes a display panel that is foldable, and a protective film disposed on the display panel and including a main body, a thin film zone, and a pair of bumps disposed on opposite sides of the thin film zone and disposed between the main body. A thickness of the thin film zone is less than that of the main body, and a thickness of each of the pair of bumps is greater than that of the main body. The foldable display apparatus further includes a sub-layer disposed on the protective film, and a folding portion where the protective film is foldable. The thin film zone and the pair of bumps are disposed in the folding portion, and a portion of the sub-layer is disposed on a first bump of the pair of bumps.

In an exemplary embodiment of the present inventive concept, the sub-layer includes a heat sink plate disposed on the protective film. An end portion of the heat sink plate is disposed on the first bump. The sub-layer further includes a cushion film disposed on the heat sink plate.

In an exemplary embodiment of the present inventive concept, when the foldable display apparatus is folded, the end portion of the heat sink plate is provided between the pair of bumps.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

In the specification and the drawings, like reference numerals may denote like or corresponding elements, and to the extent that repeated description thereof is omitted, it may be assumed that the omitted description is at least similar to descriptions of corresponding elements found elsewhere in the specification.

It will be understood that although the terms "first", "second", etc. may be used herein to describe various components, these components are only used to distinguish one component from another.

It will be understood that when a layer, region, or element is referred to as being "formed on", or "disposed on" another layer, region, or element, it can be directly on or intervening layers, regions, or elements may be present.

Sizes of elements in the drawings may be exaggerated for convenience of explanation.

Figure 1A:
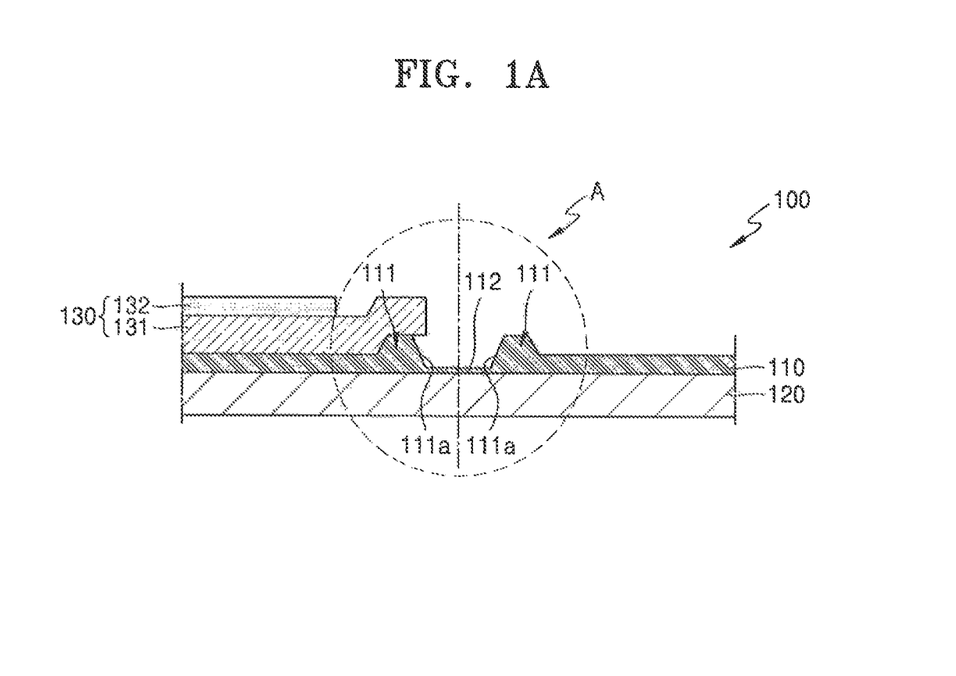
FIGS. 1A and 1B are cross-sectional views respectively illustrating an unfolding state and a folding state of a foldable display apparatus according to an exemplary embodiment of the present inventive concept.
Figure 1B:
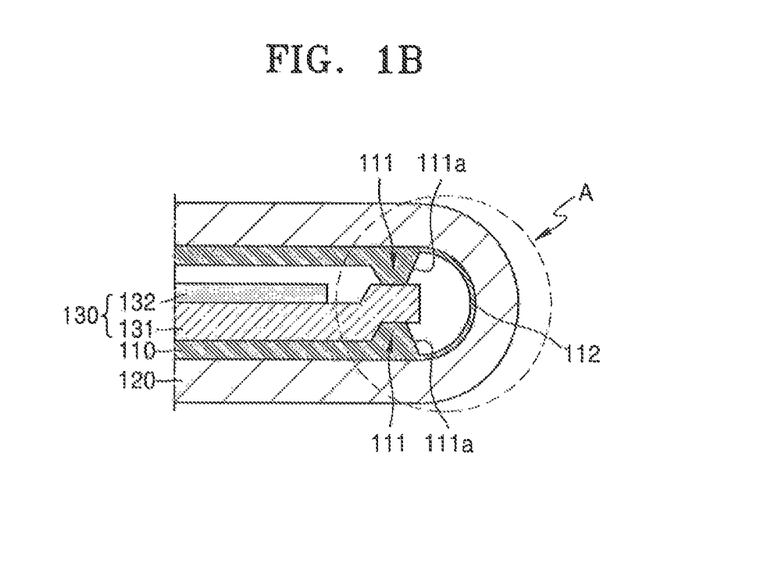

FIGS. 1A and 1B are cross-sectional views respectively illustrating an unfolding state and a folding state of a foldable display apparatus 100 according to an exemplary embodiment of the present inventive concept.

The foldable display apparatus 100 may include a display panel 120 that is flexible, a protective film 110 disposed on one surface of the display panel 120, and a sub-layer 130 including a heat sink plate 131 and a cushion film 132 disposed on the protective film 110. The display panel 120 may generally have a structure including a thin film transistor and a light-emitting device to produce an image, an encapsulation layer covering and protecting the thin film transistor and the light-emitting device, etc. stacked on a flexible substrate of the foldable display apparatus 100. Since a flexible substrate is used instead of a hard or rigid glass substrate, the display panel 120 may be freely folded and unfolded within an allowed range of its flexibility. Accordingly, in a folding state, the foldable display apparatus 100 may remain folded by being folded as illustrated in FIG. 1B.

The foldable display apparatus 100 may be used while accommodated in an exterior case. For example, the foldable display apparatus 100 may be enclosed in a housing.

In the folded state, the foldable display apparatus 100 is folded such that the display panel 120 is located outside of the foldable display apparatus 100 and the protective film 110 and the sub-layer 130 are located inside of the foldable display apparatus 100. For example, when the display panel 120 is folded, a lower surface of the display panel 120, which is a surface on which an image to be viewed by a user is formed, is exposed to the outside after being folded.

A folding portion A is a portion where folding of the display apparatus 100 is performed, and the protective film 110 is removed to a predetermined depth in the folding portion A to facilitate a folding operation. For example, by removing a portion of the protective film 110 corresponding to the folding portion A, a total thickness of the foldable display apparatus 100 decreases in the folding portion A so that folding may be more easily performed. By removing a portion of the protective film 110, a thin film zone 112 may be formed in protective film 110 that corresponds to the folding portion A. By forming a thin film zone 112 without completely removing the portion of the protective film 110 corresponding to the folding portion A so that a discontinuous end portion is not formed, peeling of the protective film 110 in the folding portion A due to repeated folding and unfolding operations may be prevented. For example, the protective film 110 in the folding portion A may be made to be thin so that folding may be more easily performed, and the thin film zone 112 is left so that an end portion, which may be a start point of peeling, does not occur to prevent peeling.

However, a pair of protrusions that includes a pair of bumps 111 is incidentally formed at both sides of the thin film zone 112 in a process of removing the protective film 110 of the folding portion A as above. For example, the protective film 110 of the folding portion A may be removed by using a heating element such as a heat block 200 (see FIG. 2B) to contact and heat the protective film 110 such that the contacted and heated portion of the protective film 110 melts. In this state, a part of the removed portion is displaced by the heating element. For example, part of the removed portion is pushed to opposite sides of the heating element, forming the pair of bumps 111 protruding upward nearby. In FIG. 1A, the upper surface of the bumps 111 is shown as substantially flat. However, when the bumps 111 are formed, the bumps 111 have a convex shape or rounded shape as shown in FIG. 2C. When foldable display apparatus 100 is folded as shown in FIG. 1B, the bumps 111 are in close contact with an end portion of the heat sink plate 131, which is a part of the sub-layer 130, and thus the bumps 111 are in a pressed state. The pressed state may be an elastic deformation state that may be restored to the state shown in FIG. 2C (e.g., an upper surface having a convex shape), when unfolded, or a plastic deformation state in which the state as shown in FIG. 1A is just maintained (e.g., a substantially flat upper surface), when unfolded. The thin film zone 112 and the pair of bumps 111 are formed together in a process of melting the protective film 110 with the heat block 200 (see FIG. 2B). Inclined surfaces 111a are formed on surfaces of the pair of bumps 111 which face the thin film zone 112. The inclination of the inclined surfaces 111a may be adjusted by a head shape of the heat block 200. This will be described later.

In an exemplary embodiment of the present inventive concept, when the upper surfaces of the bumps 111 are substantially flat, each upper surface may have a different size. However, the present inventive concept is not limited thereto. For example, each upper surface may have substantially the same size.

The sub-layer 130 includes the heat sink plate 131 disposed on the protective film 110 and the cushion film 132 disposed on the heat sink plate 131, as described above. In addition, elements such as a touch pad may be included in the sub-layer 130.

The heat sink plate 131 is arranged such that an end portion of the heat sink plate 131 is positioned on one of the bumps 111, as shown in FIGS. 1A, 1B, and 2C. For example, the heat sink plate 131 is arranged such that in the folding state as shown in FIG. 1B, an end portion of the heat sink plate 131 is provided (e.g., sandwiched) between the pair of bumps 111 and is pressed by the pair of bumps 111. In this case, since the pair of bumps 111 and the heat sink plate 131 are firmly held in contact with each other and support the folding portion A, a problem that the folding portion A is severely pressed and thus a middle portion of the folding portion A is broken may be prevented. In this way, risks such as peeling of the protective film 110 due to repeated bending and unbending of the display panel 120 may be reduced or prevented, and thus, a stable folding operation may be provided.

A detailed manufacturing process of the foldable display apparatus 100 including the formation of the bumps 111 and the thin film zone 112 is described later. Prior to the description of the manufacturing process of the foldable display apparatus 100, an internal structure of the display panel 120 is briefly described below with reference to FIGS. 5A and 5B.

Figure 5A:
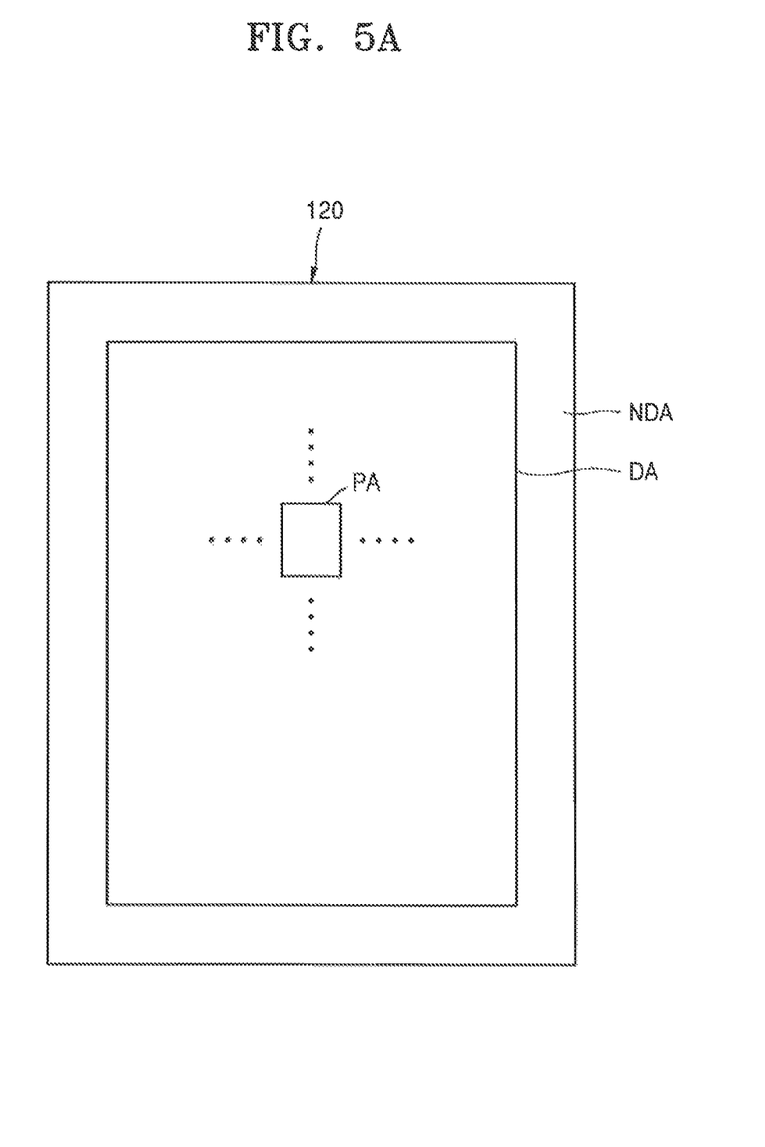
FIG. 5A is a plan view of a display panel shown in FIG. 1A according to an exemplary embodiment of the present inventive concept.

FIG. 5A schematically illustrates a planar structure of the display panel 120, which includes a display area DA displaying an image and a non-display area NDA adjacent to the display area DA. The display area DA includes a plurality of pixel areas PA, and a pixel emitting a light is formed in each of the pixel areas PA. An image is formed by the lights emitted by a plurality of pixels provided in the display area DA.

The non-display area NDA may be arranged to at least partially surround the display area DA, and may include a driving unit such as a scan driving unit and a data driving unit to transmit signals to the pixels provided in the display area DA.

Although FIG. 5A illustrates a case in which the non-display area NDA surrounds the display area DA, the present inventive concept is not limited thereto. According to an exemplary embodiment of the present inventive concept, the non-display area NDA may be arranged at one side only of the display area DA to reduce an area where an image is not displayed, for example, a dead area.

Figure 5B:
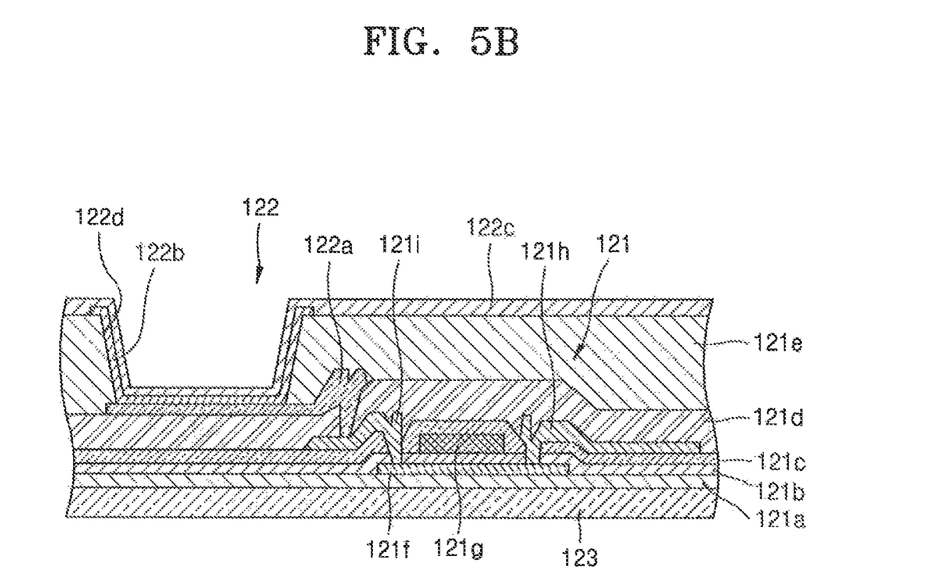
FIG. 5B is a cross-sectional view illustrating an internal structure of the display panel shown in FIG. 5A according to an exemplary embodiment of the present inventive concept.

A thin film transistor 121 and an organic light-emitting device 122 are provided in one of the pixel areas PA of the display area DA, as illustrated in FIG. 5B. First, in the structure of the thin film transistor 121, a buffer layer 121a is formed on a flexible substrate 123 including, for example, a polyimide material. In addition, an active layer 121f is formed over the buffer layer 121a, and the active layer 121f includes source and drain regions in which N-type or P-type impurities are doped at a high concentration. The active layer 121f may include an oxide semiconductor. For example, the oxide semiconductor may include oxide of a material selected from Group 12, Group 13, and Group 14 metal elements such as Zn, In, Ga, Sn, Cd, Ge, or Hf, and a combination thereof. For example, a semiconductor active layer 121f may include G—I—Z—O[(In$_2$O$_3$)a(Ga$_2$O$_3$)b (ZnO)c], where "a", "b", and "c" are real numbers respectively satisfying conditions that a≥0, b≥0, and c>0. A gate electrode 121g is formed over the active layer 121f with a gate insulating film 121b interposed therebetween. A source electrode 121h and a drain electrode 121i are formed over the gate electrode 121g. An interlayer insulating film 121c is provided between the gate electrode 121g, the source electrode 121h, and the drain electrode 121i. A passivation film 121d is provided between the source electrode 121h, the drain electrode 121i, and an anode electrode 122a of the organic light-emitting device 122.

An insulating planarization film 121e, such as acryl, is formed over the anode electrode 122a. After an opening 122d is formed in the insulating planarization film 121e, the organic light-emitting device 122 may be formed.

The organic light-emitting device 122 emits light of red, green, and blue colors according to a flow of current thereby displaying image information. The organic light-emitting device 122 may include the anode electrode 122a connected to the drain electrode 121i of the thin film transistor 121 and is a positively charged electrode, a cathode electrode 122c covering the entire pixel and is a negatively charged electrode, and an emission layer 122b disposed between the two electrodes 122a and 122c and emitting light. Electrical power may flow from the anode electrode 122a to the cathode electrode 122c.

A hole injection layer (HIL), a hole transport layer (HTL), an electron transport layer (ETL), an electron injection layer (EIL), etc. may be stacked adjacent to the emission layer 122b.

For reference, the emission layer 122b may be formed separately for each pixel so that pixels emitting the light of red, green, and blue colors constitute a unit pixel. In addition, an emission layer may be formed in common across the entire pixel area regardless of the location of a pixel. In this state, the emission layer 122b may be formed by vertically stacking or mixing layers including an emission material emitting the light of, for example, red, green, and blue colors. A combination of different colors is possible if a white light can be emitted. Furthermore, a color change layer or a color filter that converts the emitted white light to a specific color may be provided.

A thin film encapsulation layer in which an organic film and an inorganic film are alternately stacked may be formed over the cathode electrode 122c.

As the display panel 120 configured as above is flexibly deformable, the display panel 120 may be folded or unfolded according to folding and unfolding operations and may be used as a foldable display apparatus.

The above-described foldable display apparatus 100 may be manufactured as follows.

Figure 2A:
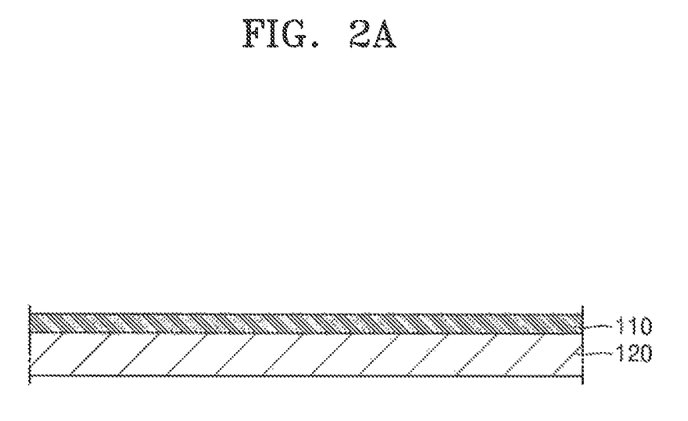
FIGS. 2A, 2B, 2C and 2D are cross-sectional views sequentially illustrating a process of manufacturing the foldable display apparatus shown in FIGS. 1A and 1B according to an exemplary embodiment of the present inventive concept.

First, as illustrated in FIG. 2A, the protective film 110 is attached on one surface of the display panel 120. The protective film 110 may include a polyethylene terephthalate resin (PET) material.

Figure 2B:
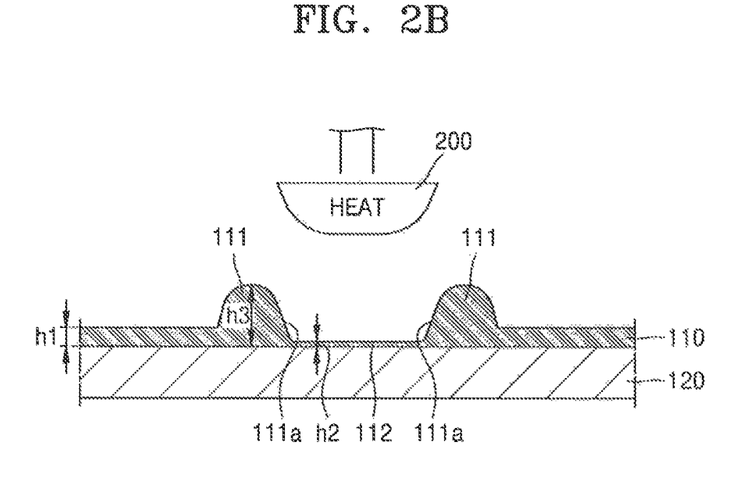
Figure 2C:
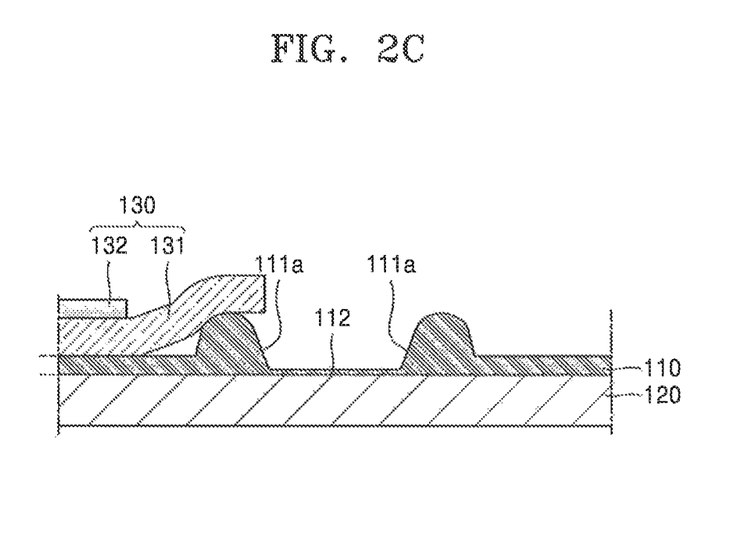

Next, as illustrated in FIG. 2B, the heat block 200 that is a heating element is moved to contact a portion of the protective film 110 corresponding to the folding portion A, thereby melting and removing at least a portion of the contacted portion of the protective film 110. In this case, the contacted portion is not completely melted and removed, and the thin film zone 112 having a thickness h2 less than the thickness h1 of the main body of the protective film 110 (e.g., peripheral portions of the protective film) is left. The heat block 200 is a heating element heated to range of about 400 to about 520° C. and may adjust the thickness of the thin film zone 112 while changing a contact pressure that the heat block 200 applies to the protective film 110 for a unit time.

Figure 4A:
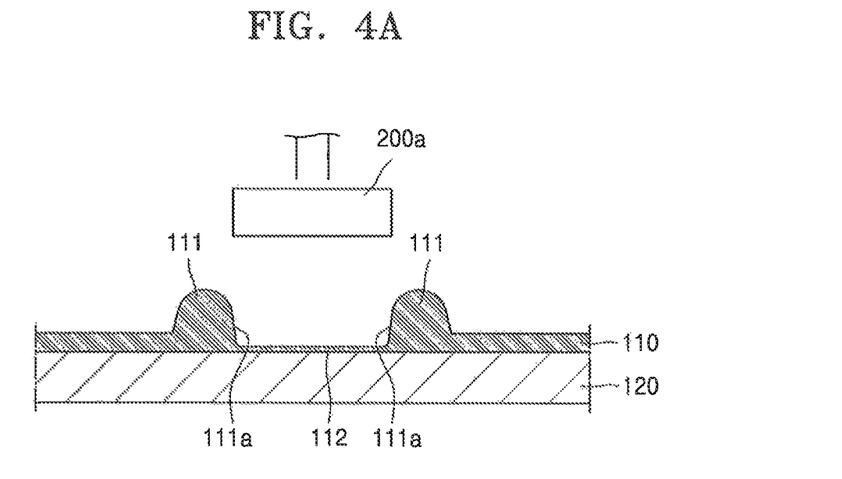
FIGS. 4A and 4B are cross-sectional views illustrating a method of forming a thin film zone and a bump shown in FIG. 2B according to an exemplary embodiment of the present inventive concept.
Figure 4B:
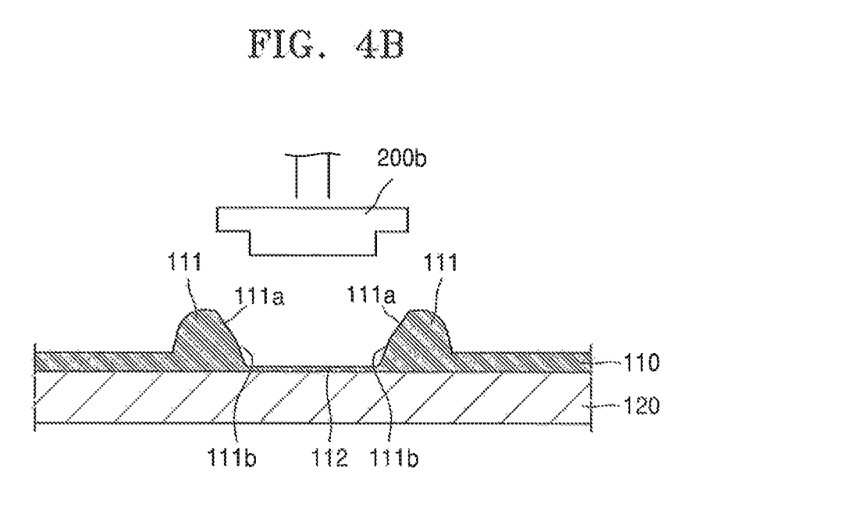

In this case, a part of the portion removed by the heat block 200 is pushed toward both (e.g., opposite) side edges of the thin film zone 112 to form a pair of bumps 111, and the bumps 111 protrude with a thickness h3, which is greater than the thickness h1 of the main body of the protective film 110. For example, the pair of bumps 111 are formed between the main body of the protective film 110. Each of the surfaces of the bumps 111, which face the thin film zone 112, is an inclined surface 111a having a predetermined inclination. If the inclined surface 111a needs to have a more rapid inclination, the shape of a cross section of a head of the heat block 200 may be adopted as a quadrangle as shown in FIG. 4A instead of a rounded shape as shown in FIG. 2B. If a plurality of inclined surfaces 111a and 111b having different inclinations are required to be formed as shown in FIG. 4B, the shape of the cross section of the head of the heat block 200 may be adopted as a multi-stage shape. The multi-stage shape may be a polygon, such as a rectangular shape with different widths. The slope of the inclined surface 111a may be gentle to prevent peeling. However, a heat block 200 having a quadrangular head as shown in FIG. 4A may be used to make a protruding height of the bump 111 higher to increase a pressing force with the heat sink plate 131, and a heat block 200 having a multi-stage head as shown in FIG. 4B may be used to prevent peeling and provide a moderate pressing force.

After the bump 111 and the thin film zone 112 are formed in this manner, the sub-layer 130 including the heat sink plate 131 and the cushion film 132 may be formed on the protective film 110, as shown in FIG. 2C. In this case, as described above, an end portion of the heat sink plate 131 is placed on the bump 111.

Figure 2D:
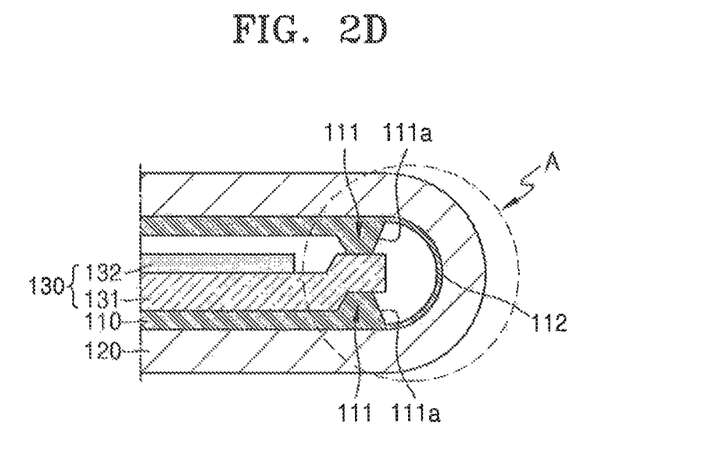

In this state, when the display apparatus 100 is folded as shown in FIG. 2D, the end portion of the heat sink plate 131 is sandwiched between the pair of bumps 111 and pressed by the pair of bumps 111 to maintain a strong support state for the folding portion A. For example, the folding portion A is not empty and the pair of bumps 111 and the end portion of the heat sink plate 131 are firmly pressed together to strongly support the form of the folding portion A, and thus, the display panel 120 might not be damaged by distortions in the folding portion A that may be due to an external force.

The thickness h2 (see FIG. 2B) of the protective film 110 in the folding portion A is reduced so that folding may be more easily performed, and in addition, the thin film zone 112 is left so that a discontinuous end portion, which may be a start point of peeling, does not occur and thus peeling does not occur even if folding and unfolding are repeated.

Accordingly, the structures of the bumps 111, the thin film zone 112, and the heat sink plate 131 may reduce the risk of peeling and wiring damage, thereby stabilizing a folding operation. As a result, the quality and reliability of the foldable display apparatus 100 may be increased.

Figure 3:
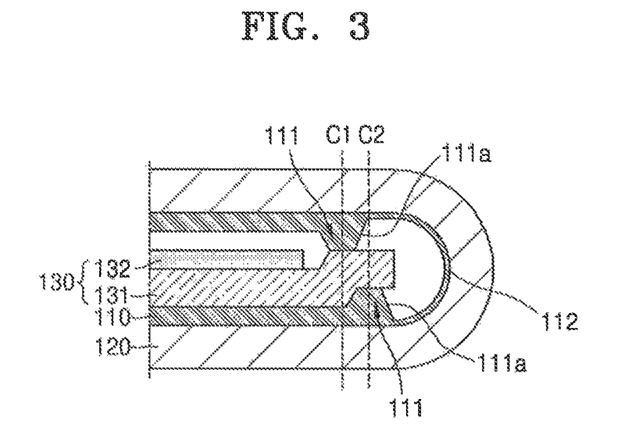
FIG. 3 is a cross-sectional view illustrating a folding state of a foldable display apparatus according to an exemplary embodiment of the present inventive concept.

In an exemplary embodiment of the present inventive concept, as shown in FIG. 1B, the pair of bumps 111 are formed on both sides of the thin film zone 112 and are arranged on the same axis such that the centers of the pair of bumps 111 coincide with each other. However, as shown in FIG. 3, the centers C1 and C2 of the pair of bumps 111 may be shifted away from each other (e.g., misaligned from each other). In addition, an end portion of the heat sink plate 131 is sandwiched between the pair of bumps 111 and pressed by the pair of bumps 111 to firmly support the folding portion A. Thus, the pair of bumps 111 do not necessarily have to be coaxially arranged.

According to the foldable display apparatus 100 and the manufacturing method thereof as described above, since the folding portion may be stably supported by the bumps 111 and the thin film zone 112, the risk of peeling of the protective film 110 and wiring damage may be reduced and thus the quality of the foldable display apparatus 100 may be stabilized.

While the present inventive concept has been particularly shown and described with reference to exemplary embodiments thereof, it will be apparent to those of ordinary skill in the art that various changes in form and detail may be made thereto without departing from the spirit and scope of the present inventive concept.

What is claimed is:
1. A foldable display apparatus comprising:
a display panel that is foldable;
a protective film, that is foldable, disposed on one surface of the display panel; and
a sub-layer disposed on the protective film,
wherein a folding portion of the display apparatus comprises:
a thin film zone, of the protective film, that is thinner than a main body of the protective film; and a pair of bumps disposed on opposing sides of the thin film zone, each of the pair of bumps having a thickness greater than that of the main body of the protective film, and wherein when the foldable display apparatus is in a folding state, a portion of the sub-layer is provided between the pair of bumps and is pressed by the pair of bumps.

2. The foldable display apparatus of claim 1, wherein the sub-layer comprises:
a heat sink plate disposed on the protective film; and
a cushion film disposed on the heat sink plate.

3. The foldable display apparatus of claim 2, wherein in the folding state, the heat sink plate is provided between the pair of bumps and pressed by the pair of bumps.

4. The foldable display apparatus of claim 1, wherein each bump of the pair of bumps includes a first inclined surface that is in contact with the thin film zone.

5. The foldable display apparatus of claim 4, wherein the first inclined surface has a plurality of different inclinations.

6. The foldable display apparatus of claim 1, wherein in the folding state, centers of the pair of bumps coincide with each other.

7. The foldable display apparatus of claim 1, wherein in the folding state, centers of the pair of bumps are shifted away from each other.

8. A method of manufacturing a foldable display apparatus, the method comprising:
providing a protective film on one surface of a display panel that is foldable;
forming a thin film zone that is thinner than both a main body of the protective film and a pair of bumps protruding from the main body of the protective film on opposite sides of the thin film zone by removing a portion of the protective film corresponding to a folding portion of the display panel to a predetermined depth, wherein each of the pair of bumps has a thickness greater than that of the main body of the protective film; and
forming a sub-layer on the protective film and arranging the sub-layer such that while in a folding state, a portion of the sub-layer is provided between the pair of bumps and is pressed by the pair of bumps.

9. The method of claim 8, wherein the forming of the thin film zone and the pair of bumps comprises heating and melting the portion of the protective film corresponding to the folding portion.

10. The method of claim 9, wherein the heating is performed by contact with a heat block.

11. The method of claim 10, wherein the heat block is heated to a range of about 400 to about 520° C.

12. The method of claim 10, wherein a cross section of a head of the heat block contacting the protective film is round, quadrangular, or a multi-staged shape.

13. The method of claim 10, wherein a thickness of the thin film zone is adjusted by varying a contact pressure of the heat block.

14. The method of claim 8, wherein inclined surfaces are formed on surfaces of the pair of bumps which are in contact with the thin film zone when forming the pair of bumps and the thin film zone.

15. The method of claim 14, wherein each inclined surface has a plurality of different inclinations.

16. The method of claim 8, wherein the sub-layer comprises a heat sink plate disposed on the protective film and a cushion film disposed on the heat sink plate.

17. The method of claim 16, wherein in the folding state, the heat sink plate is provided between the pair of bumps and is pressed by the pair of bumps.

18. The method of claim 8, wherein in the folding state, centers of the pair of bumps coincide with each other.

19. The method of claim 8, wherein in the folding state, centers of the pair of bumps are shifted away from each other.

20. The method of claim 8, wherein a folding direction of the folding portion is a direction in which the display panel goes to face outward of the foldable display apparatus and the protective film comes to face inward of the foldable display apparatus.

21. A foldable display apparatus comprising:
a display panel that is foldable;
a protective film disposed on the display panel and including a main body, a thin film zone, and a pair of bumps disposed on opposite sides of the thin film zone and disposed between the main body, wherein a thickness of the thin film zone is less than that of the main body, and a thickness of each of the pair of bumps is greater than that of the main body;
a sub-layer disposed on the protective film; and
a folding portion where the protective film is foldable, wherein the thin film zone and the pair of bumps are disposed in the folding portion, and a portion of the sub-layer is disposed on a first bump of the pair of bumps.

22. The foldable display apparatus of claim 21, wherein the sub-layer comprises:
a heat sink plate disposed on the protective film, wherein an end portion of the heat sink plate is disposed on the first bump; and
a cushion film disposed on the heat sink plate.

23. The foldable display apparatus of claim 22, wherein when the foldable display apparatus is folded, the end portion of the heat sink plate is provided between the pair of bumps.

* * * * *